United States Patent
Wang et al.

(10) Patent No.: US 9,666,545 B2
(45) Date of Patent: May 30, 2017

(54) SEMICONDUCTOR DEVICE WITH ADVANCED PAD STRUCTURE RESISTANT TO PLASMA DAMAGE AND METNOD FOR FORMING SAME

(71) Applicant: TAIWAN SEMICONDUCTOR MANUFACTURING CO., LTD., Hsin-Chu (TW)

(72) Inventors: Hung-Chih Wang, Hsinchu (TW); Yao-Hsiang Liang, Shinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/198,442

(22) Filed: Jun. 30, 2016

(65) Prior Publication Data

US 2016/0315058 A1 Oct. 27, 2016

Related U.S. Application Data (60) Division of application No. 14/637,456, filed on Mar. 4, 2015, now Pat. No. 9,385,081, which is a
(Continued)

(51) Int. Cl.
*H01L 21/76* (2006.01)
*H01L 23/00* (2006.01)
(Continued)

(52) U.S. Cl.
CPC ........ *H01L 24/05* (2013.01); *H01L 21/76841* (2013.01); *H01L 23/528* (2013.01);
(Continued)

(58) Field of Classification Search
CPC ....... H01L 2924/00; H01L 2924/00014; H01L 2924/01029; H01L 2224/32225;
(Continued)

(56) References Cited

U.S. PATENT DOCUMENTS 6,630,736 B1 10/2003 Ignaut
6,960,831 B2 11/2005 Burrell et al.
(Continued)

FOREIGN PATENT DOCUMENTS

JP 2003179059 6/2003
JP 2006190884 7/2006

OTHER PUBLICATIONS

Office Action dated Jul. 28, 2014 from related Korean Patent Application No. 10-2013-0086663, 19 total pages.

*Primary Examiner* — Roy Potter
*Assistant Examiner* — Paul Patton
(74) *Attorney, Agent, or Firm* — Duane Morris LLP (57) ABSTRACT

A connective structure for bonding semiconductor devices and methods for forming the same are provided. The bonding structure includes an alpad structure, i.e., a thick aluminum-containing connective pad, and a substructure beneath the aluminum-containing pad that includes at least a pre-metal layer and a barrier layer. The pre-metal layer is a dense material layer and includes a density greater than the barrier layer and is a low surface roughness film. The high density pre-metal layer prevents plasma damage from producing charges in underlying dielectric materials or destroying subjacent semiconductor devices.

20 Claims, 4 Drawing Sheets

Related U.S. Application Data continuation of application No. 13/792,744, filed on Mar. 11, 2013, now Pat. No. 9,006,900.

(51) Int. Cl.

| | | |
|---|---|---|
| *H01L 21/768* | (2006.01) | |
| *H01L 23/532* | (2006.01) | |
| *H01L 23/528* | (2006.01) | |
| *H01L 27/088* | (2006.01) | |
| *H01L 23/522* | (2006.01) | |

(52) U.S. Cl.
CPC .. *H01L 23/53223* (2013.01); *H01L 23/53238* (2013.01); *H01L 24/00* (2013.01); *H01L 24/03* (2013.01); *H01L 24/13* (2013.01); *H01L 27/088* (2013.01); *H01L 23/522* (2013.01); *H01L 2224/0218* (2013.01); *H01L 2224/0219* (2013.01); *H01L 2224/0345* (2013.01); *H01L 2224/03452* (2013.01); *H01L 2224/0401* (2013.01); *H01L 2224/05025* (2013.01); *H01L 2224/05073* (2013.01); *H01L 2224/05124* (2013.01); *H01L 2224/05624* (2013.01); *H01L 2924/01013* (2013.01); *H01L 2924/01022* (2013.01); *H01L 2924/01031* (2013.01); *H01L 2924/01049* (2013.01); *H01L 2924/01073* (2013.01); *H01L 2924/04941* (2013.01); *H01L 2924/04953* (2013.01); *H01L 2924/13091* (2013.01); *H01L 2924/206* (2013.01); *H01L 2924/30201* (2013.01)

(58) Field of Classification Search
CPC ... H01L 2924/04941; H01L 2924/0002; H01L 2924/01013
See application file for complete search history.

(56) References Cited

U.S. PATENT DOCUMENTS

| | | |
|---|---|---|
| 8,456,856 B2 | 6/2013 | Lin et al. |
| 9,006,900 B2 | 4/2015 | Wang et al. |
| 2002/0121703 A1 | 9/2002 | Toyoda et al. |
| 2006/0154464 A1 | 7/2006 | Higashi |
| 2007/0190784 A1* | 8/2007 | Cui ............... H01L 21/76825 438/687 |
| 2012/0032236 A1 | 2/2012 | Yamazaki et al. |

* cited by examiner

SEMICONDUCTOR DEVICE WITH ADVANCED PAD STRUCTURE RESISTANT TO PLASMA DAMAGE AND METNOD FOR FORMING SAME

REFERENCE TO RELATED APPLICATION

This application is a division of U.S. application Ser. No. 14/637,456, filed Mar. 4, 2015, which is a continuation of U.S. application Ser. No. 13/792,744, filed Mar. 11, 2013, which is incorporated by reference herein in its entirety.

BACKGROUND

The disclosure relates to semiconductor devices and methods for forming the same. Semiconductor devices are used in various electronic and other devices throughout the world. Once the semiconductor device fabrication process is completed, the fabricated semiconductor device is coupled to external components using various assembly processes. One common assembly process is a bonding process whereby the semiconductor device is bonded to a bonding wire or a bumping material such as a solder bump or solder ball.

Semiconductor devices include one or numerous conductive metal layers. The conductive metal layers serve as wiring layers and couple the various device components to one another through dielectric materials. The conductive metal layers are formed over one another and at various device levels. Each semiconductor device includes an uppermost, top metal wiring layer. The top metal wiring layer of the semiconductor device must be coupled to a solder bump or other external component as part of the assembly process and in order for the semiconductor device to be utilized. Some connective technologies utilize thick material layers or other processes such as lengthy deposition processes, that can cause plasma damage to the semiconductor device. The plasma can charge the dielectric materials formed over the top metal layer and propagate through the metal layers and to transistors and other devices formed on the substrate or between the metal layers, through an antenna-type effect. When this charge undesirably reaches metal gate or other transistors formed in the semiconductor device, including on the substrate, this charge can cause blowout of the gate and destruction of the functionality of the transistor and of the entire semiconductor device.

It would be desirable to provide assembly methods and connective structures in which plasma damage to the transistors and other components of the semiconductor device, is prevented.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a connective structure for coupling a semiconductor device to a solder ball or bonding wire and a method for forming the structure. The structure includes Alpad technology with a relatively thick aluminum-containing contact pad over the device metallization layers and this aluminum-containing contact pad ("Alpad") is coupled to the solder ball or bonding wire. A dielectric is disposed over the top metal layer of the semiconductor device and a composite material of a dense layer and a barrier material layer is disposed between the dielectric layer and the aluminum-containing contact pad. The dense material layer is formed of the same material as the barrier layer in some embodiments and they are formed of different materials in other embodiments. The dense material layer is a high density/low roughness film that prevents plasma induced charging of the subjacent dielectric materials and subjacent electronic components. The dense material layer is formed using a comparatively low energy process.

Figure 1:
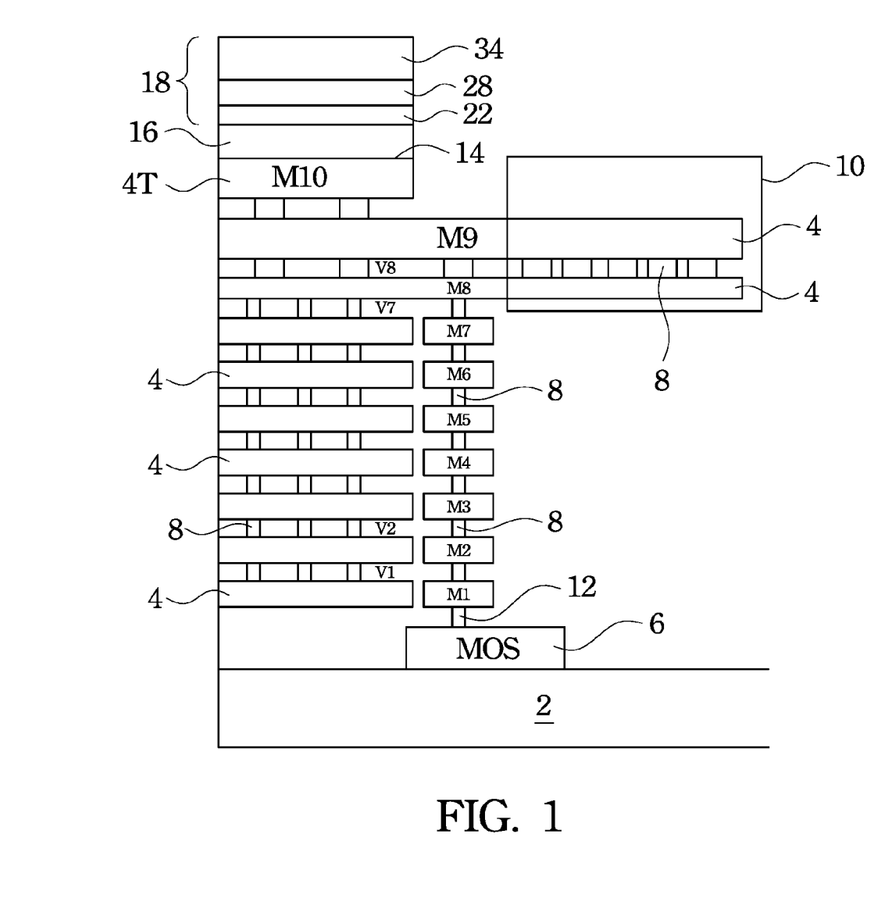
FIG. 1 is a cross-sectional view showing a portion of a semiconductor device including an alpad structure according to the disclosure.

FIG. 1 is a cross sectional view showing a portion of an embodiment of a semiconductor device formed on and over substrate 2. Various suitable semiconductor and other materials are used for substrate 2 in various embodiments. In one embodiment, substrate 2 is formed of silicon but other suitable materials are used in other embodiments. The semiconductor device formed on and over substrate 2 is an integrated circuit in some embodiments and various other semiconductor devices in other embodiments. The semiconductor device includes multiple metal interconnect layers. Various metals such as aluminum, aluminum silicon, copper, and various alloys are used as the metal layers. In some embodiments, the semiconductor device includes about five to ten metal layers but fewer or more metal layers are used in other embodiments.

In the illustrated embodiment of FIG. 1, there are a maximum of ten metal layers but other numbers of metal layers are used in other embodiments. The ten metal layers 4 include top metal layer 4T and metal layers 4 are coupled to one other by vias 8 but other metal-to-metal interconnect features are used in other embodiments. In one embodiment, the ten metal layers 4 are each formed of the same material and in other embodiments, the ten metal layers 4 are formed of different materials. In one embodiment, each metal layer 4 is formed of copper. In another embodiment, each metal layer 4 is formed of aluminum but other suitable conductive films are used in other embodiments. Metal layers 4 are separated from one another by a dielectric material. Various suitable dielectric materials such as oxides, nitrides, oxynitrides, high-k dielectrics, and other suitable dielectric materials are used. The same or different dielectric materials are used to separate the various metal layers 4 and the nature of the dielectric material is determined, at least in part, by the type of metal being isolated by the dielectric materials.

Vias 8 extend through the dielectric layers to couple metal layers 4 and are formed of various suitable conductive materials such as but not limited to aluminum, aluminum silicon, copper, aluminum copper and various alloys. In some embodiments, vias 8 include barrier type materials such as tungsten, W, or other suitable barrier materials, as liners. Various methods are used to form metal layers 4, vias 8 and the dielectric materials disposed between the conductive features.

Top metal layer 4T is the tenth metal layer in the illustrated embodiment but in other embodiments, different numbers of metal layers are used and thus, the top metal layer represents a different metallization layer in other embodiments. In the illustrated embodiment of FIG. 1, there are ten metal layers including top metal layer 4T but in some portions, the tenth metal layer is not present and there are only nine metal layers 4. Stated alternatively, in some portions, the tenth, top metal layer 4T is not needed and the ninth metal layer is the uppermost metal layer. MOS transistor 6 is coupled to metal layers 4 by conductive structure 12. Conductive structure 12 is a contact or other suitable conductive structure in other embodiments. MOS transistor 6 is a metal gate transistor in some embodiments and MOS transistor 6 is a polysilicon gate transistor in other embodiments and in still other embodiments, MOS transistor 6 is a floating-gate transistor with an upper gate and a floating gate, each formed of silicon or other suitable materials. In still other embodiments, MOS transistor 6 is formed of other materials. MOS transistor 6 is representative of a multitude of MOS transistors and other devices and components that are present and combine to form the semiconductor device.

Antenna structure 10 includes two metal layers 4 coupled by via 8 and represents a structure sensitive to the "antenna effect." The antenna effect involves charging in a discrete conductive layer region formed over the surface of a substrate that causes excessive current that can charge and damage the characteristics of underlying dielectric materials. Plasma etching and various deposition processes involving a glow discharge naturally result in electric charging in some regions of the upper substrate surface and cause the antenna effect. The resulting "antenna effect" causes excessive current by which the characteristics of an oxide or other dielectric layer located beneath the conductive layer can be severely degraded, and which can further cause blowout of underlying conductive or semiconductor components. The antenna effect occurs when conductive feature act as "antennas" amplifying the charging effect. Antenna structure 10 represents one embodiment of a conductive structure that acts as an antenna. FIG. 1 shows that antenna structure 10 utilizes metal layers M8 and M9 in a portion of the device where metal layer M9 is the uppermost layer. In other embodiments, antenna structure 10 represents a structure formed in portions of the device that include top metal layer 4T and in those regions, antenna structure 10 may utilize top metal layer 4T and one or more subjacent metal layers. The antenna effect may be produced as a result of structures at various metal levels of the semiconductor device formed on substrate 2. In other embodiments, various other structures serve as antennas.

FIG. 1 also shows dielectric layer 16 formed over upper surface 14 of top metal layer 4T and connective structure 18 formed over dielectric layer 16. Connective structure 18 includes first dense barrier layer 22, second barrier layer 28, and conductive pad layer 34. These materials are shown in more detail in FIG. 2. Connective structure 18 and dielectric layer 16 are formed over the semiconductor device which may alternatively be referred to as the device sub structure.

Figure 2:
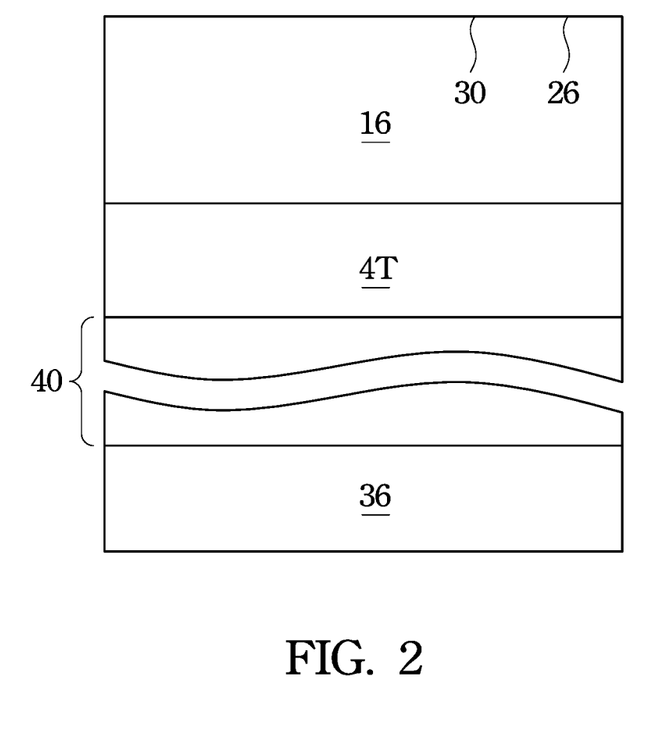
FIG. 2 is a cross-sectional view showing a step in the method of forming an alpad structure according to the disclosure.

FIG. 2 shows an embodiment of a structure upon which connective structure 18 is formed. In FIG. 2, only a portion of dielectric layer 16 and connective structure 18 are shown in the illustrated embodiment but it should be understood that in other portions of the semiconductor device, an opening extends through dielectric layer 16 and a via or other connective structure couples at least a conductive pad of conductive pad layer 34 to top metal layer 4T through dielectric layer 16.

FIG. 2 schematically shows top metal layer 4T disposed over device structure 36. In some embodiments, device structure 36 is the gate of MOS transistor 6 shown in FIG. 1. In one embodiment, device structure 36 is a metal gate, in another embodiment, device structure 36 is a polysilicon gate, and in yet another embodiment, device structure 36 is formed of other materials. Device structure 36 is also an upper gate of a floating gate electrode and formed of various suitable materials, in other embodiments. In other embodiments, device structure 36 represents other semiconductor device structures that are sensitive to plasma damage such as may be experienced due to the antenna effect. Structure 40 schematically represents device structure between top metal layer 4T and device structure 36. Structure 40 may essentially represent the structure shown in FIG. 1 in one embodiment. In other embodiments, structure 40 includes various semiconductor device components, interconnect materials and structures, dielectric materials and other structures. In some embodiments, structure 40 includes various electrical connections between top metal layer 4T and device structure 36.

Dielectric layer 16 is formed over upper surface 14 of top metal layer 4T. Various suitable dielectric materials such as oxides, nitrides, oxynitrides, high-k dielectrics, and other suitable dielectric materials are used for dielectric layer 16. Dielectric layer 16 is formed using various methods and includes various thicknesses. Connective structure 18 is formed over dielectric layer 16 as will be shown in FIG. 3.

Figure 3:
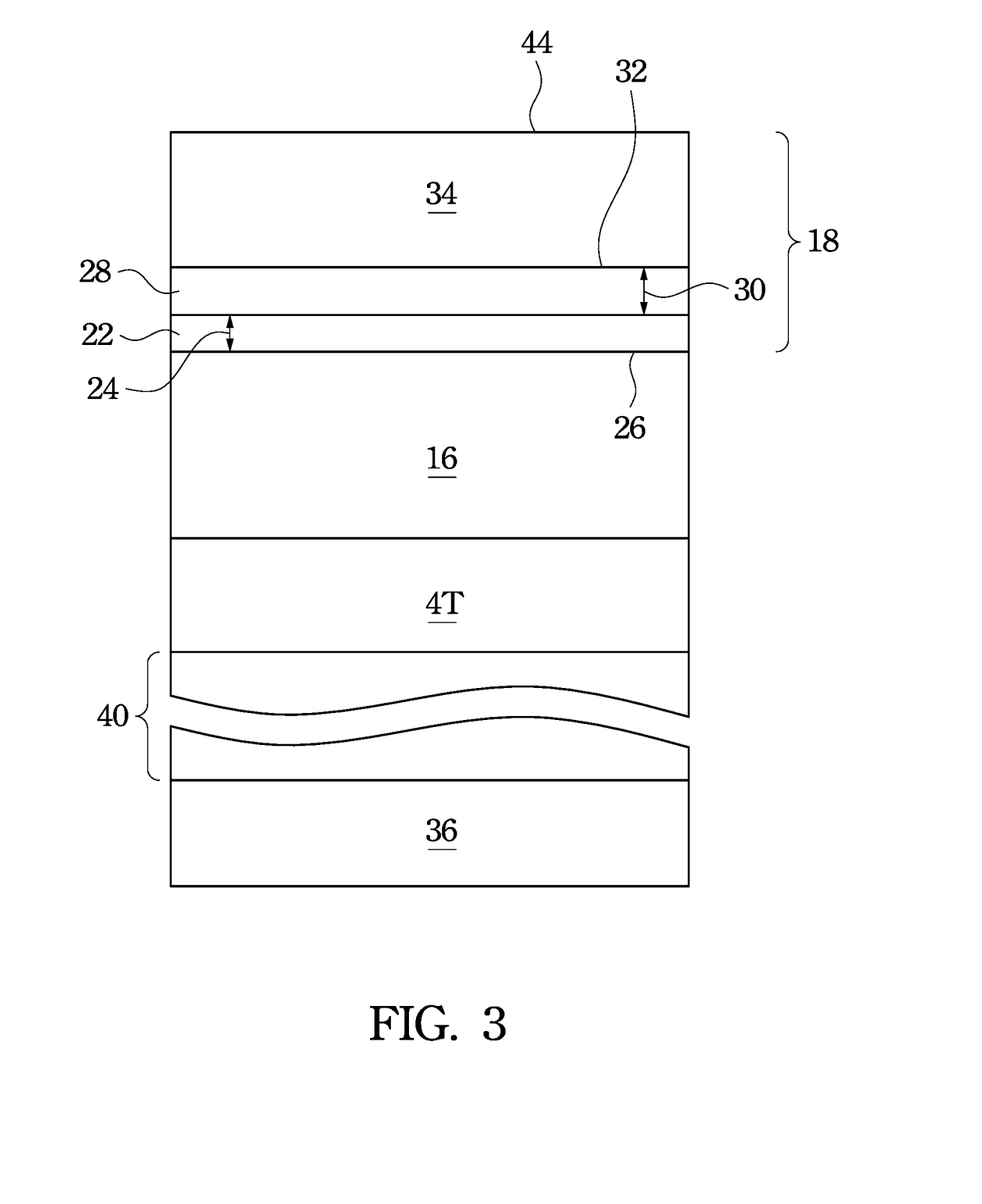
FIG. 3 is a cross-sectional view showing an alpad structure according to the disclosure.

Referring to FIG. 3, connective structure 18 includes a high density, low roughness first dense barrier layer 22 formed using a low energy deposition process, and second barrier layer 28 which includes a lower density than first dense barrier layer 22. Together, first dense barrier layer 22 and second barrier layer 28 form a composite barrier layer. Second barrier layer 28 includes a rougher surface than first dense barrier layer 22 and is formed using a deposition process that uses a higher power than the deposition process used to form first dense barrier layer 22 and form a composite barrier layer structure.

In one embodiment, first dense barrier layer 22 and second barrier layer 28 are formed of the same material but wherein first dense barrier layer 22 has a higher density and lower surface roughness than second barrier layer 28. First dense barrier layer 22 is therefore formed of barrier-type material in various embodiments and can be described as a "dense" film layer. In other embodiments, first dense barrier layer 22 and second barrier layer 28 are formed of different materials. Suitable materials used for either or both of first dense barrier layer 22 and second barrier layer 28 include Ta, TaN, TiN, Ti, In, and Ga, combinations thereof, but other suitable refractory metals and compounds formed of refractory metals are used in other embodiments. In one embodiment in which first dense barrier layer 22 and second barrier layer 28 are formed of the same material, a continuous deposition process is carried out in one process chamber, whereby one or some of the process parameters and/or process conditions remain the same and one or some of the process parameters and/or process conditions are changed to effectuate the deposition of the two distinct films—first dense barrier layer 22 and second barrier layer 28. According to this embodiment, throughput is maximized and processing time is minimized. In one embodiment, the processes for the deposition of the two distinct films include the same process gases and differ by only one or several processing parameters such as temperature, pressure or power. In one embodiment, atomic layer deposition, ALD is used to form either or both of first dense barrier layer 22 and second barrier layer 28. In other embodiments, either or both of first dense barrier layer 22 and second barrier layer 28 are formed using chemical vapor deposition, CVD or sputtering, i.e., physical vapor deposition.

According to some embodiments, first dense barrier layer 22 is formed using a deposition process that utilizes various process gases and includes a temperature within a range of about 50-300° C. but other temperatures are used in other embodiments. The pressure in the deposition chamber for the first dense barrier layer 22 deposition process ranges from about $1\text{-}9E^{-3}$ torr to about $1\text{-}9E^{-5}$ torr in some embodiments but other pressures are used in other embodiments. In some embodiments, the power used in the first dense barrier layer 22 deposition process ranges from about 10 W to about 1000 W but other powers are used in other embodiments.

According to some embodiments, second barrier layer 28 is formed using a deposition process that utilizes various process gases and includes a temperature within a range of about 50-300° C. but other temperatures are used in other embodiments. The process gases are the same as those used to form first dense barrier layer 22, in some embodiments. The pressure in the deposition chamber for the second barrier layer 28 deposition process ranges from about $1\text{-}9E^{-3}$ torr to about $1\text{-}9E^{-5}$ torr in some embodiments but other pressures are used in other embodiments. In some embodiments, the power used in the second barrier layer 28 deposition process ranges from about 1000 W to about 6000 W but other powers are used in other embodiments.

The power used in the deposition process used to form first dense barrier layer 22 is a lower power than the power used to form second barrier layer 28 in most embodiments and the deposition pressure used to form first dense barrier layer 22 is a higher pressure than the pressure used in the deposition process used to form second barrier layer 28. In one embodiment, the deposition processes for forming first dense barrier layer 22 and second barrier layer 28 differ by the addition of argon to the first dense barrier layer 22 deposition process or the use of a greater amount, i.e. higher gas flow, of argon in the first dense barrier layer 22 deposition process. Additional argon increases the pressure in the deposition chamber and the density of the formed film layer.

In one embodiment, thickness 24 of first dense barrier layer 22 is about 50 angstroms and in other embodiments, thicknesses of about 25-100 angstroms are produced, and in still other embodiments, other thicknesses are used. First dense barrier layer 22 is a high density, low roughness film. Upper surface 26 of first dense barrier layer 22 includes a surface roughness of about 4.5 nm in one embodiment, a surface roughness of about less than about 5 nm in another embodiment and other surface roughnesses in other embodiments. First dense barrier layer 22 includes a density of about 20 g/cm$^3$ in one embodiment, a density of about 18-22 g/cm$^3$, a density of about 15-25 g/cm$^3$ in other embodiments and still other densities in other embodiments.

In one embodiment, thickness 30 of second barrier layer 28 is about 600 angstroms and in other embodiments, thicknesses of about 500-700 angstroms are used and in still other embodiments, other thicknesses are used. Second barrier layer 28 is a low density, high roughness film compared to first dense barrier layer 22 and includes a lower density than first dense barrier layer 22 and a higher roughness than first dense barrier layer 22. Upper surface 32 of second barrier layer 28 includes a surface roughness of about 9 nm in one embodiment, a surface roughness of about 5-22 nm in other embodiments and other surface roughnesses in other embodiments. Second barrier layer 28 includes a density of about 10 g/cm$^3$ in one embodiment, a density of about 5-15 g/cm$^3$ in other embodiments and still other densities in other embodiments.

According to embodiments in which first dense barrier layer 22 and second barrier layer 28 are formed of the same material and according to embodiments in which first dense barrier layer 22 and second barrier layer 28 are formed of a different material, first dense barrier layer 22 includes a higher density and a lower surface roughness than second barrier layer 28.

Conductive pad layer 34 is an aluminum-containing material and is aluminum in one embodiment. Conductive pad layer 34 is formed of various aluminum alloys in other embodiments. In one embodiment, conductive pad layer 34 is formed of aluminum copper. In one embodiment, conductive pad layer 34 includes a thickness of about 28K angstroms, in other embodiments, conductive pad layer 34 includes a thickness ranging from about 20-40K angstroms and conductive pad layer 34 includes other thicknesses in other embodiments. Conductive pad layer 34 is formed using various film deposition processes in various embodiments. In one embodiment, sputtering, i.e. physical vapor deposition is used. The deposition process used to form conductive pad layer 34 is a blanket deposition process and not a spatially selective deposition process. This is also true for previously described processes used to form first dense barrier layer 22 and second barrier layer 28. After deposition, conductive pad layer 34 and second barrier layer 28 and first dense barrier layer 22 may be patterned to produce discrete conductive pads that are bonded to solder balls, bonding wires or other connective features that couple the semiconductor device to external components.

Regardless of the power used and plasma energy produced during the formation of conductive pad layer 34 and the patterning of the connective structure 18 by reactive ion etching or other plasma etching techniques, the semiconductor device below the composite structure of first dense barrier layer 22 and second barrier layer 28 is protected from plasma damage. Although not illustrated in FIG. 2, after discrete pads are formed from conductive pad layer 34, upper surface 44 of conductive pad layer 34 is directly bonded to solder or various bonding wires in various embodiments.

In the illustrated embodiment, connective structure 18 includes three material layers including the high density/low surface roughness first dense barrier layer 22, second barrier layer 28 and conductive pad layer 34. In other embodiments, additional layers are used.

The additional material layer or layers are disposed underneath first dense barrier layer 22 in some embodiments, between first dense barrier layer 22 and second barrier layer 28 in other embodiments, and over second barrier layer 28 in still other embodiments.

Figure 4:
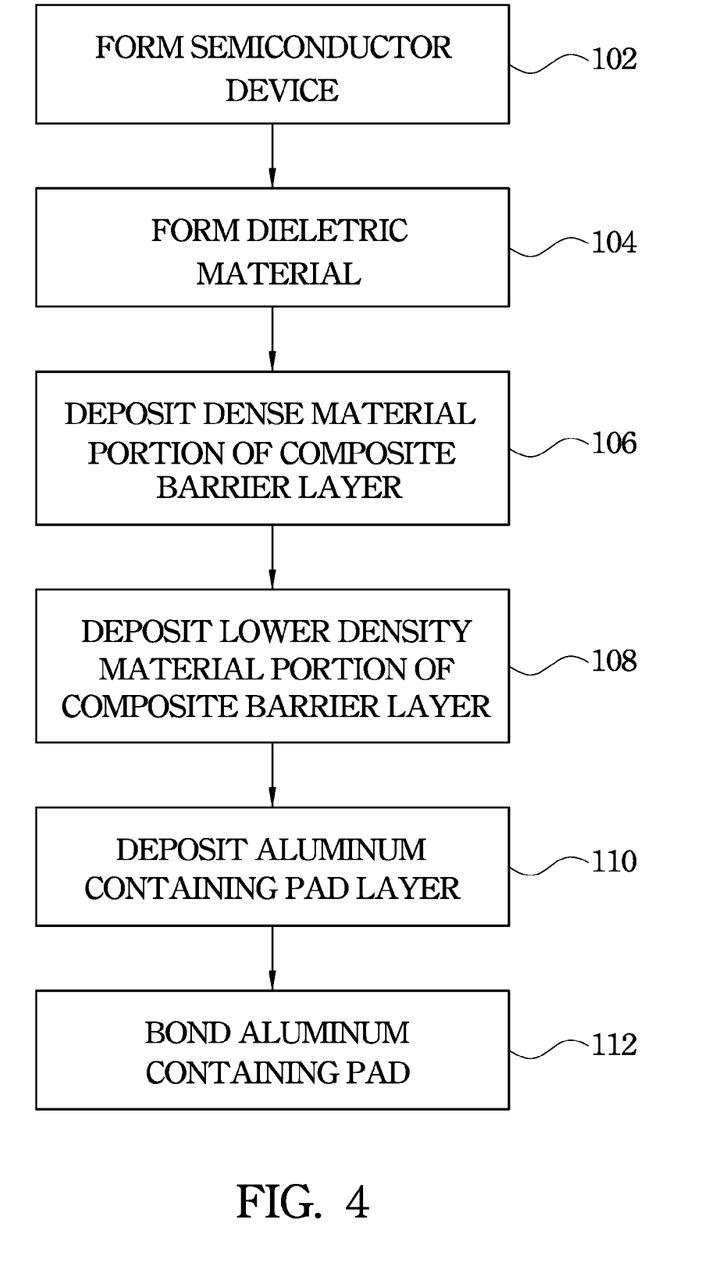
FIG. 4 is a flow chart showing a method for forming an embodiment of an alpad according to the disclosure.

FIG. 4 is a flow chart showing aspects of the method used to form an alpad according to an embodiment of the disclosure. At form semiconductor device step 102, a semiconductor device with multiple metal layers is formed. Various methods are used to form various types of semiconductor devices in various embodiments. The semiconductor devices include various components including metal gate transistor devices in some embodiments, and include a top metal layer. At form dielectric material step 104, a dielectric layer is formed over the top metal layer of the semiconductor device. Various methods and various dielectric materials are used. At deposit dense material portion of composite barrier layer step 106, first dense barrier layer 22 is formed as described above. At deposit lower density material portion of composite barrier layer step 108, second barrier layer 28 is formed as described above. At deposit aluminum containing pad layer step 110, the aluminum-containing layer is formed. The structure is then patterned to form a conductive structure such as connective structure 18 of FIG. 1 and at bond aluminum containing pad step 112, the connective structure is coupled by soldering or other suitable means, to a solder ball, bonding wire or other component coupled to outside components. The bonding may form a part of a packaging method in some embodiments.

According to some aspects, the disclosure provides a semiconductor device comprising: a semiconductor device having at least one metal layer including a top metal layer; a dielectric material disposed over the top metal layer; a dense material layer disposed over the dielectric material, the dense material layer comprising a high-density, low-roughness barrier-type material; a barrier layer disposed over the dense material layer; and an aluminum-containing connective pad disposed over the barrier layer.

In some embodiments, the dense material layer and the barrier layer are formed of the same material and have different densities and the barrier layer is disposed directly on the dense material layer.

In some embodiments, the semiconductor device further comprises the aluminum connective pad coupled to the top metal layer through an opening that extends at least through the dielectric material and further contacting a solder bump and wherein each of the dense material layer and the barrier layer is formed of TaN and the aluminum-containing connective pad has a thickness in a range of about 20K-40K angstroms.

In some embodiments, the at least one metal layer comprises 5-10 metal layers and the semiconductor device includes a plurality of metal gate MOS transistors.

In some embodiments, the dense material layer includes a density of about 18-22 g/cm$^3$.

In some embodiments, the dense material layer includes a density greater than a density of the barrier layer.

In some embodiments, the dense material layer includes a thickness of about 25-100 angstroms, the barrier layer includes a thickness in a range of about 500-700 angstroms and the aluminum-containing connective pad is coupled to the top metal layer through an opening that extends at least through the dielectric material.

In some embodiments, the dense material layer is formed of a first material, the barrier layer is formed of the first material, the dense material layer includes a density greater than a density of the barrier layer and the first material comprises one of Ta, TaN, Ti, and TiN.

In some embodiments, the dense material layer includes a surface roughness less than about 5 nm.

In some embodiments, the barrier layer includes a surface roughness greater than the dense material layer surface roughness and within a range of about 8-15 nm.

According to some aspects, the disclosure provides a method for forming a semiconductor device, the method comprising: forming a semiconductor device with at least one metal layer including a top metal layer; forming a dielectric material over the top metal layer; depositing a dense material layer using a deposition process including a low power, process gases and further deposition parameters; depositing a barrier layer having a lower density than the dense material, over the dense material layer using a further deposition process using the process gases and the further deposition parameters and a higher power than the low power; and depositing an aluminum-containing connective layer over the barrier layer.

In some embodiments, the method further comprises forming an opening through the dielectric material prior to the depositing and wherein at least the aluminum containing connective pad is coupled to the top metal layer through a conductive structure within the opening and wherein the deposition process includes a higher pressure than the further deposition process.

In some embodiments, the depositing a dense material layer includes depositing a first material having a thickness of about 25-100 angstroms and a surface roughness less than about 5 nm and the depositing a barrier layer includes depositing the first material having a thickness of about 500-700 angstroms and a surface roughness within the range of about 8-15 nm, and wherein the first material comprises one of Ta, TaN, Ti, and TiN.

In some embodiments, the depositing a dense material uses a power in the range of about 10 W to about 1000 W and a pressure in the range of about 1-9E$^{-3}$ torr to 1-9E$^{-5}$ torr and the depositing a barrier layer includes a power of about 100 0W to about 6000 W and a pressure of about 1-9E$^{-3}$ torr to about 1-9E$^{-5}$ torr.

In some embodiments, the depositing a dense material layer and the depositing a barrier layer each comprise one of atomic layer deposition (ALD), chemical vapor deposition (CVD) and sputtering.

According to some aspects, the disclosure provides a method for forming a semiconductor device. The method comprises: forming a semiconductor device with at least one metal layer including a top metal layer; forming a dielectric material over the top metal layer; forming a dense material layer of a first material and having a density of about 18-22 g/cm$^3$ over the dielectric material layer using a first deposition process; forming a barrier layer of the first material, on the dense material layer using a second deposition process, the second deposition process including a higher power and a lower pressure than the first deposition process; and forming an aluminum-containing connective layer over the barrier layer.

In some embodiments, each of the first deposition process and the second deposition process comprises one of atomic layer deposition, chemical vapor deposition (CVD), and sputtering.

In some embodiments, the barrier layer includes a density of less than about 15 g/cm$^3$ and the first material is TaN.

In some embodiments, the forming a dense material layer includes a power ranging from about 10 W to about 1000 W and a pressure ranging from about 1-9E$^{-3}$ torr to about 1-9E$^{-5}$ torr and the forming a barrier layer includes a pressure of about 1-9E$^{-3}$ torr to about 1-9E$^{-5}$ torr and a power of about 1000 W to about 6000 W In some embodiments, the first material is one of Ta, TaN, Ti, and TiN, the forming a dense material layer includes a deposition pressure being greater than a deposition pressure of the forming a barrier layer and the dense material layer includes a surface roughness less than a surface roughness of the barrier layer.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the device or structure be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a semiconductor device, said method comprising:
    forming a semiconductor device with at least one metal layer including a top metal layer;
    forming a dielectric material over said top metal layer;
    depositing a first material layer using a deposition process including a first power, process gases and further deposition parameters;
    depositing a barrier layer having a lower density than said first material, over said first material layer using a further deposition process using said process gases and said further deposition parameters and a higher power than said first power; and
    depositing an aluminum-containing connective layer over said barrier layer.

2. The method as in claim 1, further comprising forming an opening through said dielectric material prior to depositing said first material layer and wherein at least said aluminum containing connective layer is coupled to said top metal layer through a conductive structure within said opening and wherein said deposition process includes a higher pressure than said further deposition process.

3. The method as in claim 1, wherein said step of depositing said first material layer includes depositing a first material having a thickness of about 25-100 angstroms and a surface roughness less than about 5 nm and said step of depositing said barrier layer includes depositing said first material having a thickness of about 500-700 angstroms and a surface roughness within the range of about 8-15 nm, and wherein said first material comprises one of Ta, TaN, Ti, and TiN.

4. The method as in claim 3, wherein said step of depositing said first material uses a power in the range of about 10 W to about 1000 W and a pressure in the range of about $1\text{-}9E^{-3}$ torr to $1\text{-}9E^{-5}$ torr and said depositing a barrier layer includes a power of about 1000 W to about 6000 W and a pressure of about $1\text{-}9E^{-3}$ torr to about $1\text{-}9E^{-5}$ torr.

5. The method as in claim 3, wherein said step of depositing said first material layer and said step of depositing said barrier layer each comprise one of atomic layer deposition (ALD), chemical vapor deposition (CVD) or sputtering.

6. The method of claim 1, wherein said first material layer comprises a low-roughness barrier-type material.

7. The method of claim 1, wherein said barrier layer is formed of the first material, and said barrier layer is disposed directly on said first material layer.

8. The method of claim 1, wherein said semiconductor device is a metal gate MOS transistor.

9. The method of claim 1, wherein said first material layer has a surface roughness less than a surface roughness of said barrier layer.

10. A method for forming a semiconductor device, said method comprising:
    forming a semiconductor device with at least one metal layer including a top metal layer;
    forming a dielectric material over said top metal layer;
    forming a first material layer of a first material over said dielectric material layer using a first deposition process;
    forming a barrier layer of said first material, on said first material layer using a second deposition process, said second deposition process including a higher power and a lower pressure than said first deposition process; and
    forming an aluminum-containing connective layer over said barrier layer.

11. The method as in claim 10, wherein each of said first deposition process and said second deposition process comprises one of atomic layer deposition, chemical vapor deposition (CVD), or sputtering.

12. The method as in claim 10, wherein said barrier layer includes a density of less than about 15 g/cm$^3$ and said first material is TaN.

13. The method as in claim 10, wherein said step of forming said first material layer includes a power ranging from about 10 W to about 1000 W and a pressure ranging from about $1\text{-}9E^{-3}$ torr to about $1\text{-}9E^{-5}$ torr and said forming a barrier layer includes a pressure of about $1\text{-}9E^{-3}$ torr to about $1\text{-}9E^{-5}$ torr and a power of about 1000 W to about 6000 W.

14. The method as in claim 10, wherein said first material is one of Ta, TaN, Ti, or TiN, said step of forming said first material layer includes a deposition pressure greater than a deposition pressure used in said step of forming said barrier layer and said first material layer includes a surface roughness less than a surface roughness of said barrier layer.

15. The method as in claim 10, wherein said first material layer has a density of about 18-22 g/cm$^3$.

16. A method for forming a semiconductor device, said method comprising:
    forming a semiconductor device with at least one conductive interconnect layer including a top conductive interconnect layer;
    forming a dielectric material over said top metal layer;

forming a first barrier layer of a first material over said dielectric material layer;

forming a second barrier layer of said first material, on said first barrier layer, said first barrier layer having a density greater than said second barrier layer; and forming an aluminum-containing connective layer over said barrier layer.

17. The method of claim 16, wherein said first barrier layer has a surface roughness less than a surface roughness of said second barrier layer.

18. The method of claim 16, wherein said first barrier layer and said second barrier layer are each formed of one of Ta, TaN, Ti, In, Ga and TiN.

19. The method of claim 16, wherein said aluminum-containing connective pad is coupled to said top conductive interconnect layer through an opening that extends at least through said dielectric material.

20. The method of claim 16, wherein:

the step of forming the first barrier layer is performed using a first value of a first processing parameter, the step of forming the second barrier layer is performed using a second value of the first processing parameter, the second value is different from the first value, and the first processing parameter is one of temperature, pressure or deposition power.

\* \* \* \* \*